(12) United States Patent
Zhuang et al.

(10) Patent No.: US 8,198,712 B2
(45) Date of Patent: Jun. 12, 2012

(54) HERMETICALLY SEALED SEMICONDUCTOR DEVICE MODULE

(75) Inventors: Weidong Zhuang, Millbury, MA (US); Weiping Hu, Westford, MA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/759,656

(22) Filed: Jun. 7, 2007

(65) Prior Publication Data

US 2008/0029875 A1 Feb. 7, 2008

Related U.S. Application Data

(60) Provisional application No. 60/804,108, filed on Jun. 7, 2006.

(51) Int. Cl.
*H01L 23/495* (2006.01)
*H01L 23/12* (2006.01)

(52) U.S. Cl. . 257/678; 257/704; 257/732; 257/E33.058; 257/E23.104

(58) Field of Classification Search ............... 257/692, 257/714, 678, 700, 704, 684, 728, 723, 732, 257/620, E33.058, E23.104; 361/705, 709; 174/521, 542; 363/144, 147
See application file for complete search history.

(56) References Cited

U.S. PATENT DOCUMENTS

| | | | | |
|---|---|---|---|---|
| 2,719,821 A | * | 10/1955 | Campana | 205/250 |
| 3,566,205 A | * | 2/1971 | Walker et al. | 257/735 |
| 3,721,890 A | * | 3/1973 | Ettinger et al. | 363/144 |
| 3,935,345 A | * | 1/1976 | Lema | 148/517 |
| 4,067,041 A | * | 1/1978 | Hutson | 257/675 |
| 4,115,838 A | * | 9/1978 | Yagusic et al. | 361/709 |
| 5,001,299 A | * | 3/1991 | Hingorany | 174/521 |
| 5,043,859 A | * | 8/1991 | Korman et al. | 363/147 |
| 5,436,492 A | * | 7/1995 | Yamanaka | 257/433 |
| 5,539,217 A | * | 7/1996 | Edmond et al. | 257/77 |
| 5,616,886 A | * | 4/1997 | Romero et al. | 174/542 |
| 6,020,636 A | * | 2/2000 | Adishian | 257/728 |

(Continued)

FOREIGN PATENT DOCUMENTS

JP 2002-188178 * 6/2002

OTHER PUBLICATIONS

Chevron, Prospector X5, ZIDES, Jul. 2005, pp. 1-2.*

(Continued)

*Primary Examiner* — Colleen A Matthews
*Assistant Examiner* — Galina Yushina
(74) *Attorney, Agent, or Firm* — Farjami & Farjami LLP (57) ABSTRACT

A sealed semiconductor power module that may include a rectifier, such as a silicon controlled rectifier (SCR), is provided. The module includes an AlN substrate having a bottom surface positioned on a metallic base plate and a top surface that includes a first pad and a second pad, the substrate including a copper body on both of the two major surfaces. The module also includes a first die and a second die positioned on top of the first and second pads, respectively, the first die and the second die each including a main contact area on a top surface thereof, the first die including an isolated gate area on the top surface to which is coupled a gate terminal; and first and second power terminals in direct wirebondless electrical connection via molybdenum tabs with the main contact areas of the die.

20 Claims, 8 Drawing Sheets

U.S. PATENT DOCUMENTS

| | | | | |
|---|---|---|---|---|
| 6,060,795 | A * | 5/2000 | Azotea et al. | 307/150 |
| 6,078,501 | A | 6/2000 | Catrambone et al. | |
| 6,081,039 | A * | 6/2000 | Furnival | 257/785 |
| 6,534,343 | B2 * | 3/2003 | Choi | 438/122 |
| 6,566,749 | B1 * | 5/2003 | Joshi et al. | 257/706 |
| 6,828,663 | B2 * | 12/2004 | Chen et al. | 257/678 |
| 6,898,072 | B2 * | 5/2005 | Beihoff et al. | 361/676 |
| 2003/0016502 | A1 * | 1/2003 | Yamada et al. | 361/705 |
| 2004/0007763 | A1 * | 1/2004 | Cunningham | 257/620 |
| 2005/0022376 | A1 * | 2/2005 | Alcoe | 29/837 |
| 2005/0111798 | A1 * | 5/2005 | Doiron et al. | 385/94 |
| 2007/0182008 | A1 * | 8/2007 | Hauenstein | 257/737 |
| 2007/0261418 | A1 * | 11/2007 | Nun | 62/6 |

OTHER PUBLICATIONS

Ryton Polyphenylene Sulfide Resins, Safety, Chevron Phillips Chemical Company, 2007, pp. 1-8.*

* cited by examiner

HERMETICALLY SEALED SEMICONDUCTOR DEVICE MODULE

CROSS REFERENCE TO RELATED APPLICATION

The present application claims the benefit and priority of U.S. Provisional Application Ser. No. 60/804,108 filed Jun. 7, 2006 and entitled HERMETICALLY SEALED SEMICONDUCTOR DEVICE MODULE, the entire disclosure of which is incorporated by reference herein.

FIELD OF THE INVENTION

The present application relates to semiconductor-based LCEs (load carrying equipment) and semiconductor devices for controlling power, and particularly to packages for rectifiers, including silicon controlled rectifiers, that are hermetically sealed for use in harsh environments.

BACKGROUND OF THE INVENTION

Semiconductor power modules control electrical power to circuits and devices, such as motors, actuators, controllers or the like, and are well known. When high reliability is required for use in extreme or harsh environments, such as in high performance vehicles and aircraft, including jets and fighter aircraft, it is sometimes necessary to seal the power module to prevent infiltration of moisture, dust or other contaminants into the interior of the module, and to provide internal electrical couplings that are sturdy and free of wires or cables susceptible to malfunction. For example, some fighter jets have two DO-5 metal rectifiers working in tandem. Rectifiers with ISOTOP packaging are also known.

A silicon controlled rectifier (SCR) is typically a rectifier that is controlled by a logic gate signal. An SCR may be four-layered (N-P-N-P) or may have fewer layers, and has a cathode terminal, an anode terminal and a gate terminal. A silicon controlled rectifier may be a normally off state device that restricts current flow to the leakage current, however, other types of rectifiers are well known.

For example, U.S. Pat. No. 6,078,501 discloses a power semiconductor module that may be used in rectifiers, bridges or other types of power control circuitry, and includes wire bonds, or current straps, to connect electronic circuit areas with adjacent electronic circuit areas.

SUMMARY OF THE INVENTION

A sealed semiconductor power module is provided. The module includes a substrate having a bottom surface positioned on a metallic base plate and a top surface that includes a first pad and a second pad, the substrate including a copper bonding bonded to one or both of its two major surfaces.

The module also includes a first die positioned on top of the first pad of the substrate and a second die positioned on top of the second pad of the substrate, the first die and the second die each including a main contact area on a top surface thereof, the first die including a gate area on the top surface thereof, the gate area being isolated from direct electrical contact with the main contact area of the first die. A first power terminal is in direct wirebondless electrical connection via a first tab with the main contact area of the first die, and a second power terminal is in direct wirebondless electrical connection via a tab with the main contact area of the second die; a third power terminal is in direct wirebondless electrical connection via a tab with the substrate; and a gate terminal in ohmic contact with the gate area.

Also, the package includes a cover physically attached to the base plate, the cover configured to seal the module such that a contact portion of the first power terminal, a contact portion of the second power terminal, a contact portion of the third power terminal, and a contact portion of the gate terminal are exposed over a top surface of a top of the cover.

In such a module, the first pad, the second pad, the third pad and a gate pad may be additionally provided, positioned, respectively, between the first power terminal and the main contact area of the first die, the second power terminal and the main contact area of the second die, the third power terminal and the substrate, and the gate terminal and the gate area. These pads may be comprised of molybdenum.

Also, there may be included a fourth power terminal in direct wirebondless electrical connection via another tab with the substrate and having a fourth power terminal contact portion exposed over the top surface of the top of the cover.

Further, a second gate terminal may be included, which is in ohmic contact with a cathode region of the module and having a second gate terminal contact portion exposed over the top surface of the top of the cover.

The cover may be made of two or more components, including a frame physically attached to the base plate and a lid physically attached to the frame, the lid comprising the top of the cover and including apertures configured to be traversed by the contact portions.

The copper bonding of the substrate may be directly bonded copper (DBC). Also, the substrate may be made of AlN.

The base plate may be made of molybdenum or of AlSiC.

The cover may be made mostly of an injection molded conductive polymer. In addition, the cover may include first, second, third and fourth brass inserts configured to receive, respectively, the contact portion of the first power terminal, the contact portion of the second power terminal, the contact portion of the third power terminal, and the contact portion of the fourth power terminal. The cover may be physically attached to the base plate by a high strength adhesive and is encapsulated with a soft gel.

Such a power module may include a rectifier, including a silicon controlled rectifier.

Other features and advantages of the present invention will become apparent from the following description of the invention referring to the accompanying Drawings.

DETAILED DESCRIPTION OF PREFERRED EMBODIMENTS OF THE INVENTION

Components of the sealed semiconductor power module shown in FIG. 10 will now be described with reference to FIGS. 1-9.

Figure 1:
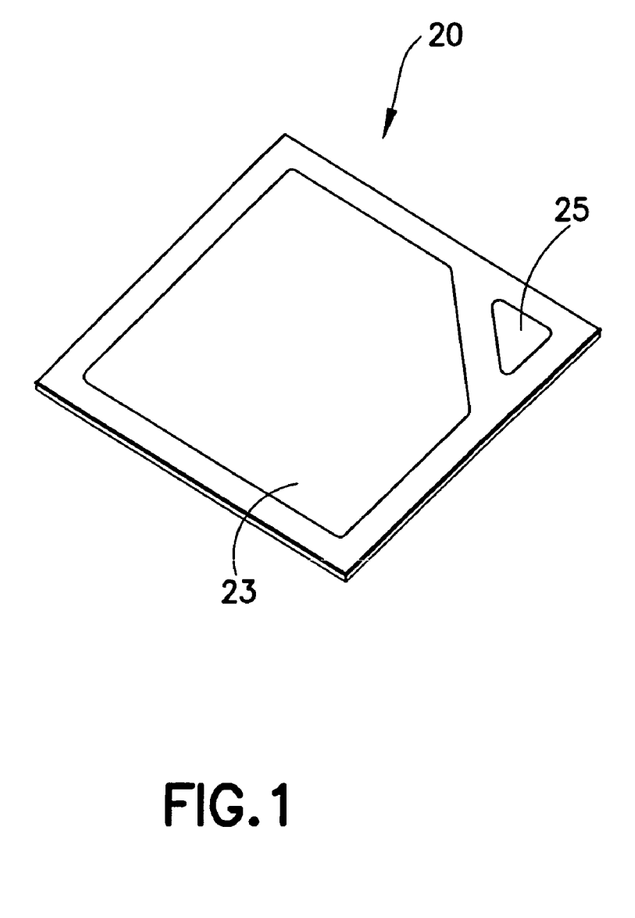
FIG. 1 is a perspective view of a top surface of a semiconductor die that includes a major contact portion and a gate contact pad portion.

FIG. 1 shows a die 20 with a first pad 23 disposed on a majority of the top surface of the die. This first pad is provided to make contact with the bottom of a power terminal or with a tab made of molybdenum positioned as part of the bottom of the power terminal. The die may be a rectifier, including an SCR, a MOSFET, an IGBT or the like. The dimensions of the die may be 0.480 inches by 0.480 inches, however, all illustrative dimensions provided herein are to be understood as being only exemplary to show some typical embodiments. FIG. 1 also shows gate contact area 25 that is used for making ohmic contact with the gate terminal.

Figure 2:
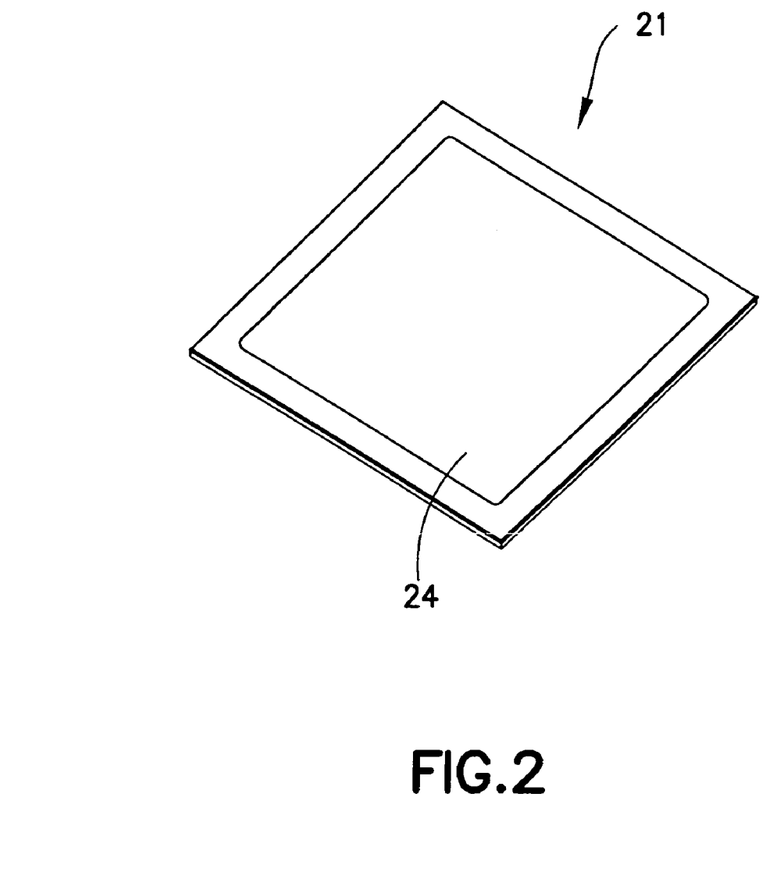
FIG. 2 is a perspective view of a top surface of a semiconductor die with a major contact portion and no gate contact pad.

FIG. 2 shows the second rectifier die 21 (for example, a diode) with main contact area 24 disposed along most of the top surface of the die. The second die 21 may be approximately the same size as the first die 20.

Figure 3:
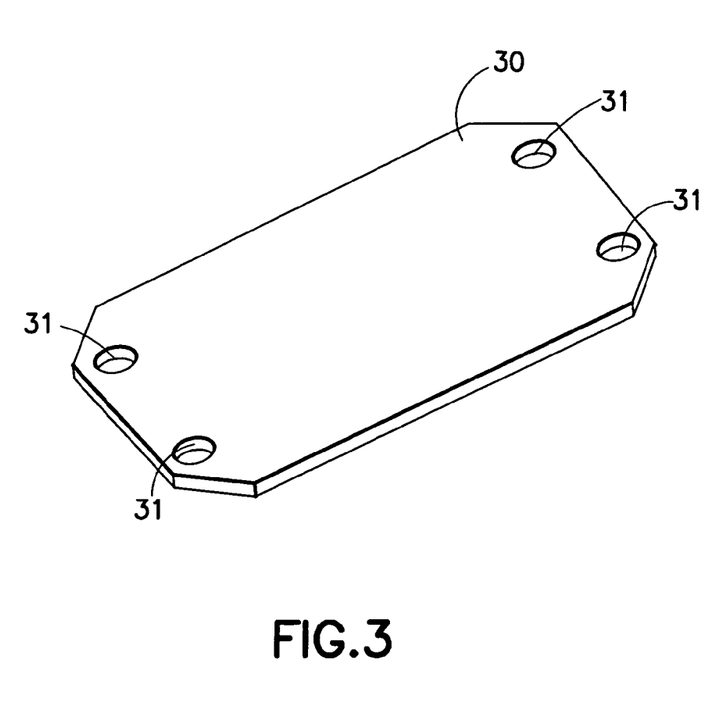
FIG. 3 is a perspective view of a base plate.

FIG. 3 shows a base plate 30 with four holes 31. The base plate 30 may be comprised of molybdenum, or may be made of AlSiC. Also, base plate 30 may be plated with nickel and gold. The base plate may be 0.060 inches thick, for example.

Figure 4:
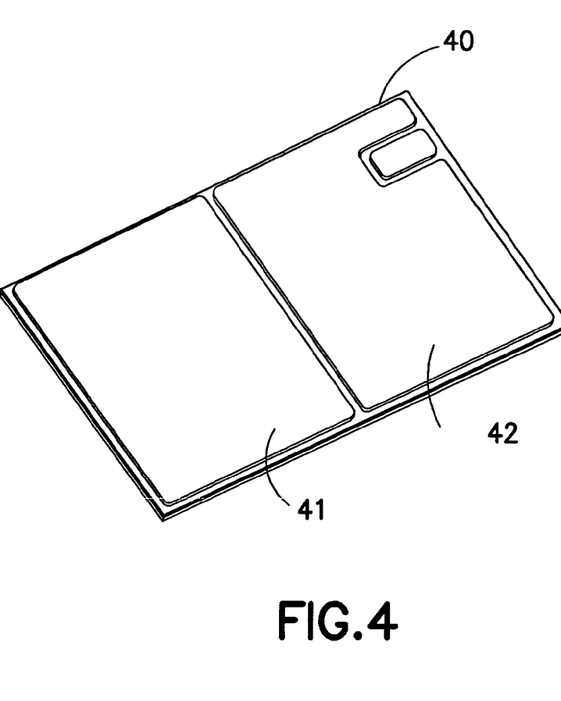
FIG. 4 is a perspective view of a substrate with two pads, each pad for receiving a die.

FIG. 4 shows the substrate 40 including a first pad 41 and a second pad 42 positioned alongside the first pad 41. The first and second pads are provided to receive the first and second die. The substrate 40 may be formed of AlN with direct bonded copper (DBC) bonding on one or both sides. The DBC bonded AlN tends to improve (decrease) thermal resistance to the base plate whereby heat may be better dissipated. The copper bonding on the substrate 40 may be 0.012 inches thick, for example. An example of the thickness of the AlN is 0.025 inches, however, as explained above, these and other dimensions are provided as illustrations only and other dimensions may be provided without departing from the spirit of the present invention.

Figure 5:
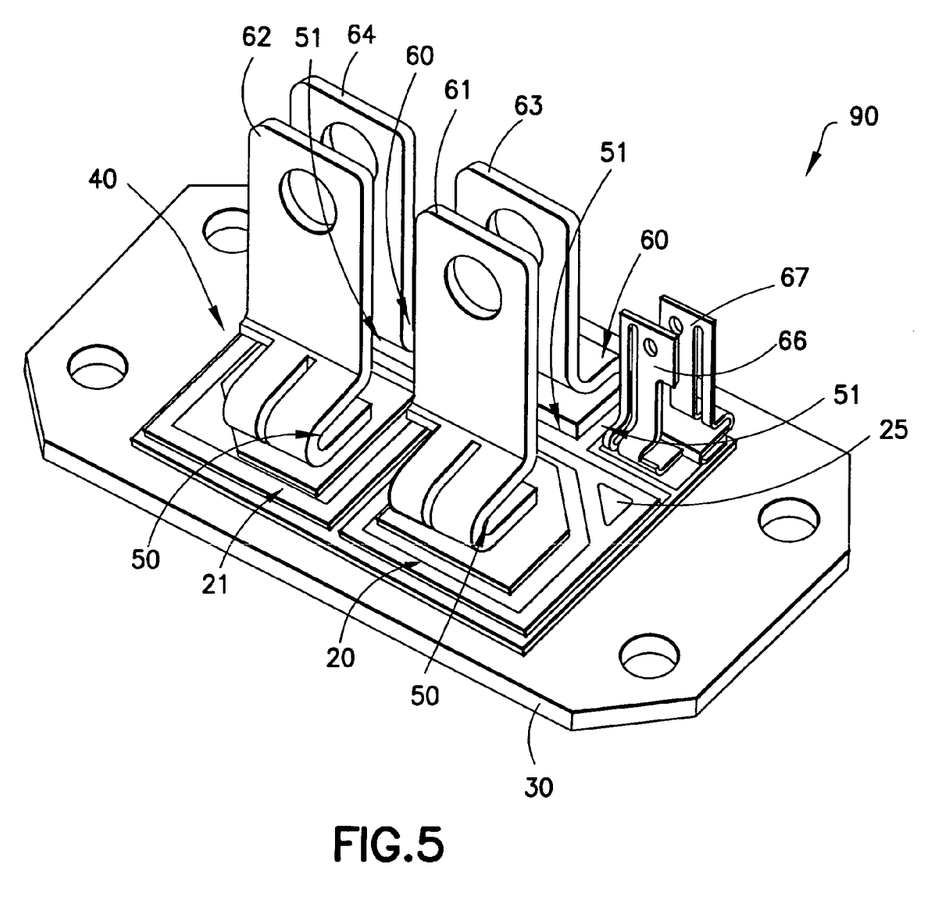
FIG. 5 is a perspective view of a semiconductor power module without the cover showing the base plate, the substrate, the die, the power terminals and the gate terminals, according to an aspect of the present invention.

FIG. 5 shows major components of the semiconductor power module 90 in an assembled state without the cover. The substrate 40 has been physically attached to the base plate 30, for example, by soldering the substrate 40 to the base plate 30 using lead and indium, for example, Pb 60%—In 40% soldering at 240 degrees Celsius, or using other solder methods.

FIG. 5 also shows molybdenum tabs 50 attached to the die 20 and 21, and molybdenum tabs attached to the gate contact area 25. For example, the Molybdenum tabs 50 may be attached to the die 20 and 21, and the die 20 and 21 may be attached to the substrate 40 using a solder of lead 92.5%—indium 5%—silver 2.5% at 360 degrees Celsius soldering temperature, or using other solders and temperatures. Gate terminal 66 is attached to gate contact area 25, and power terminals 63 and 64 are attached via molybdenum tabs 50 to the substrate 40. Power terminals 61, 62, 63 and 64 may be stress-relieved copper terminals.

For example, the power terminals 61 and 62 may be attached to the molybdenum tabs 50 using an Sn62 solder at 200 degrees Celsius. The power terminals 63 and 64 may be attached to the molybdenum tabs 50 using a solder of silver 80% and tin 20% or using Cusil (Ag 72% and Cu28%), or using other types of soldering. First gate terminal 67 and second gate terminal 67 may be attached to the gate area 25 and to the cathode portion, respectively, using a tin 62% solder at 200 degrees Celsius. The gate terminals 66 and 67 may be cut and bent and then soldered to the molybdenum tab on the gate area and the molybdenum tab on the cathode region, respectively.

Figure 6A:
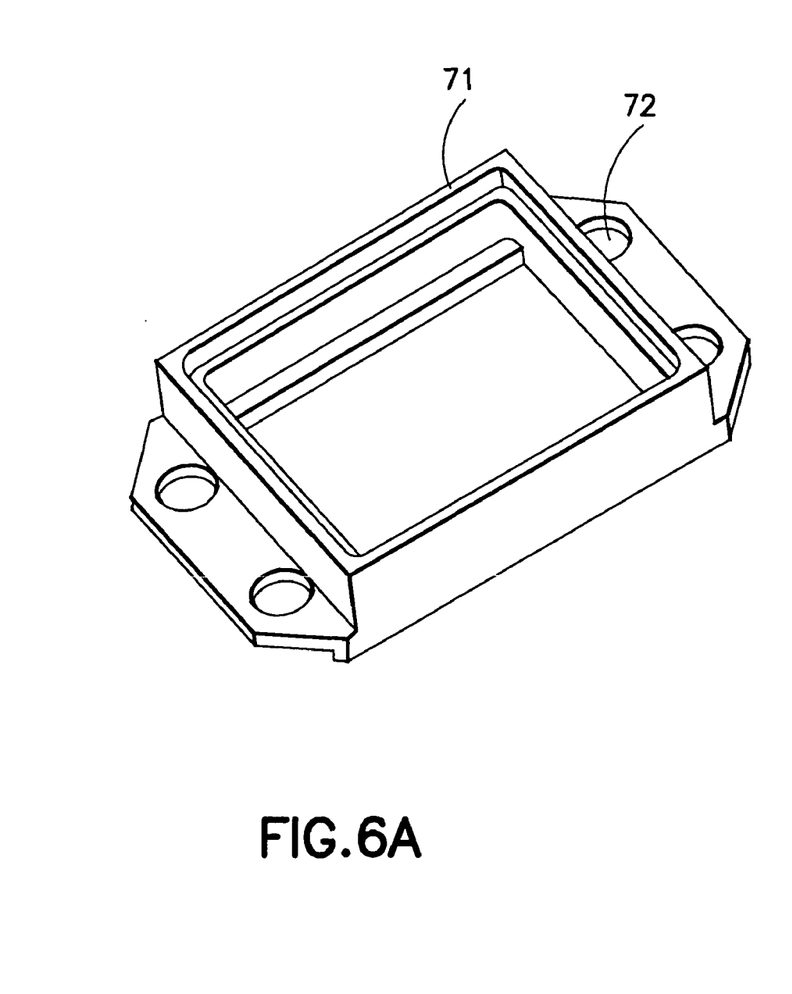
FIG. 6a is a perspective view of a package frame portion.

FIG. 6a shows the frame 71 forming the four lateral outside walls of the package, such that bottoms portions 72 of two of the four lateral outside walls are attached directly to the base plate 30.

Figure 6B:
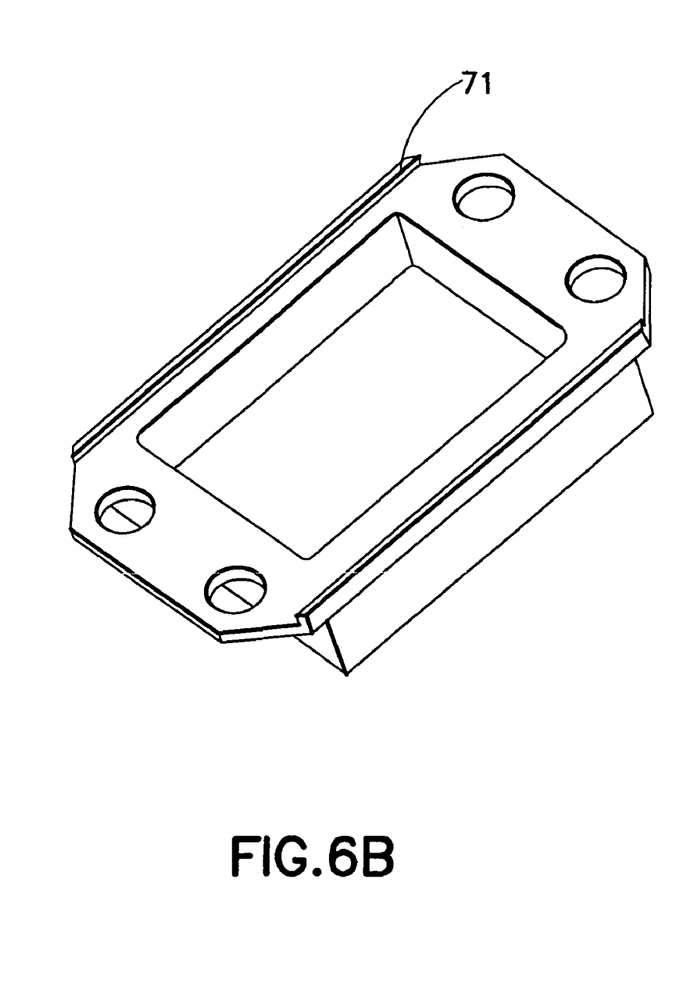
FIG. 6b is a perspective bottom view of the package frame portion.

FIG. 6b shows the underside of the frame 71 of the package.

Figure 7:
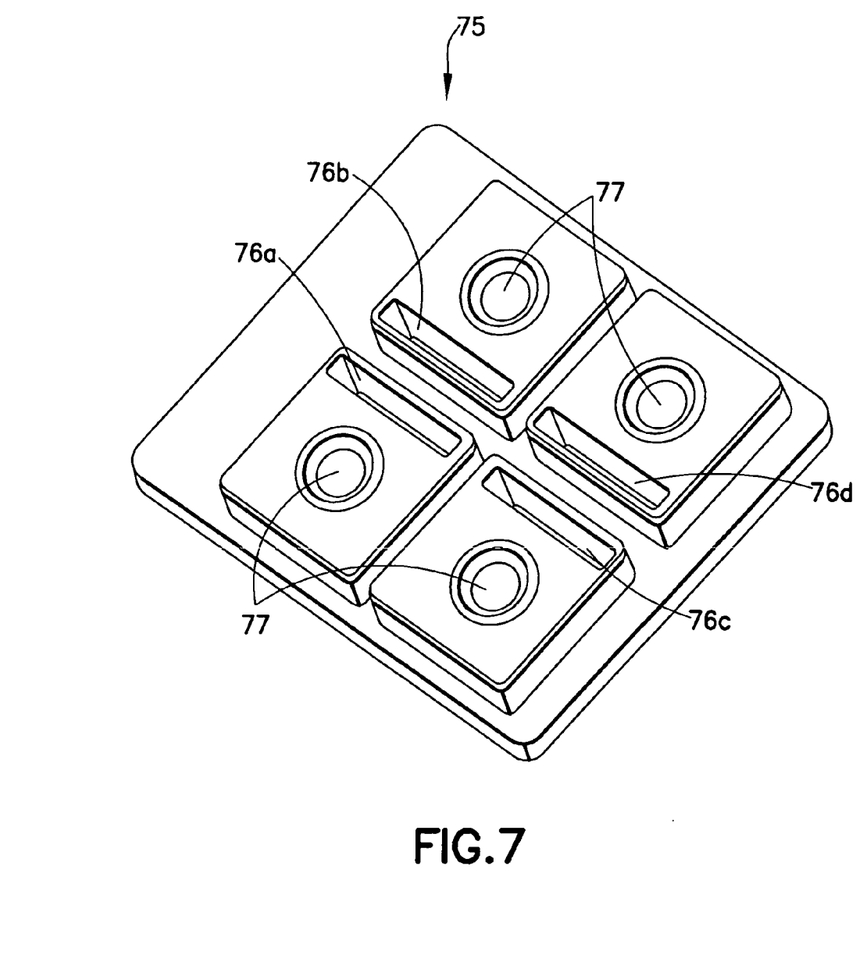
FIG. 7 is a perspective view of a lid of the package.

FIG. 7 illustrates a lid 75 for the package with apertures 76a, 76b, 76c and 76d configured to allow the power terminals to project therethrough to the outside of the package. FIG. 7 also shows first, second, third and fourth brass inserts 77 which contact the power terminals 61, 62, 63 and 64 when they are folded as shown in FIG. 10.

Figure 8:
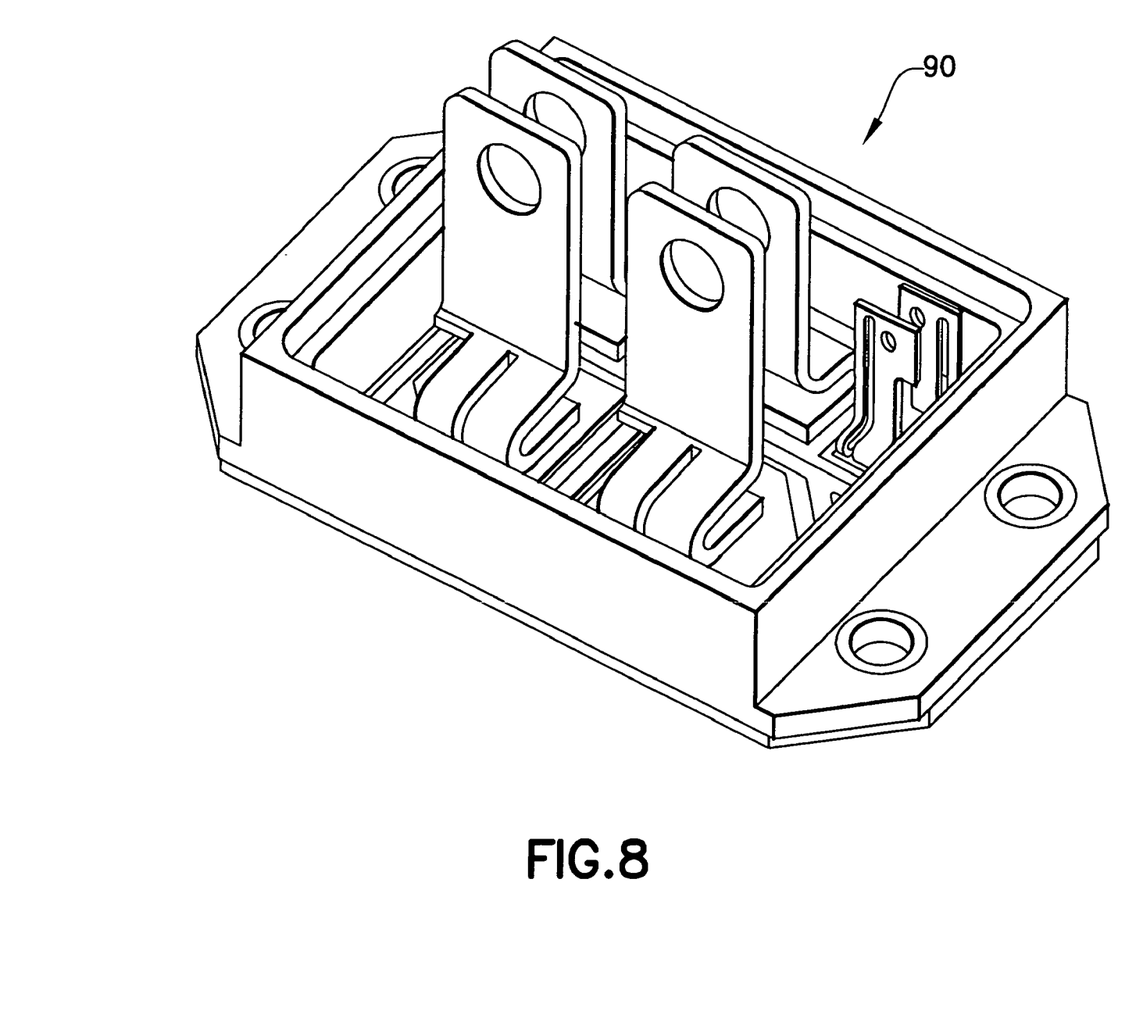
FIG. 8 is a perspective view of the assembled power module without the lid, according to an aspect of the present invention.

FIG. 8 illustrates the entire semiconductor power module 90 in an assembled state without the lid 75. In this state, the package frame 71 is attached to the base plate 30. The package frame 71 and the lid 74 may be made of an injection molded electrically conductive polymer, such as Ryton PPS, including Ryton R-4, or of other materials or combinations of materials. Also, the package frame 71 and the lid 74 may be made of different materials.

Figure 9:
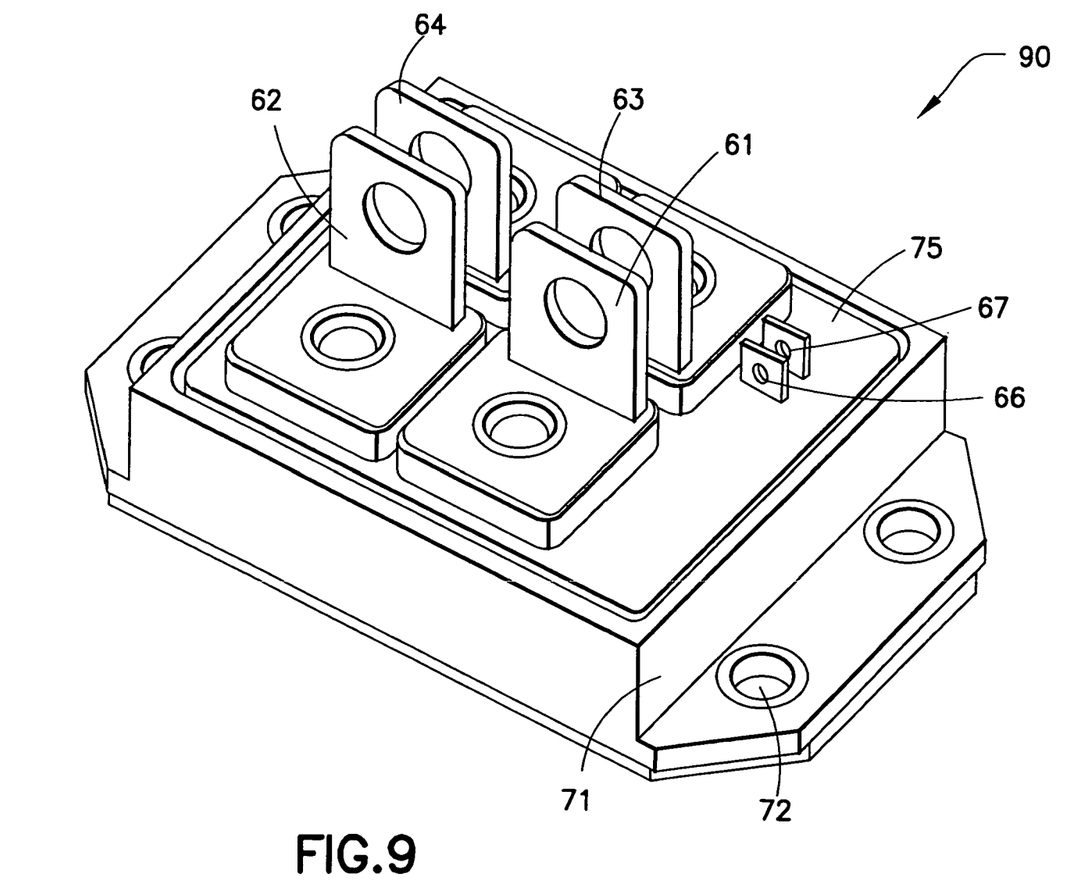
FIG. 9 is a perspective view of the assembled semiconductor power module with the lid, according to an aspect of the present invention.

FIG. 9 shows the semiconductor power module 90 in an assembled state with the power terminals 61, 62, 63, 64 protruding through the apertures 76a, 76b, 76c and 76d. FIG. 9 also shows the gate terminals 66 and 67 protruding through apertures in the lid 75.

Figure 10:
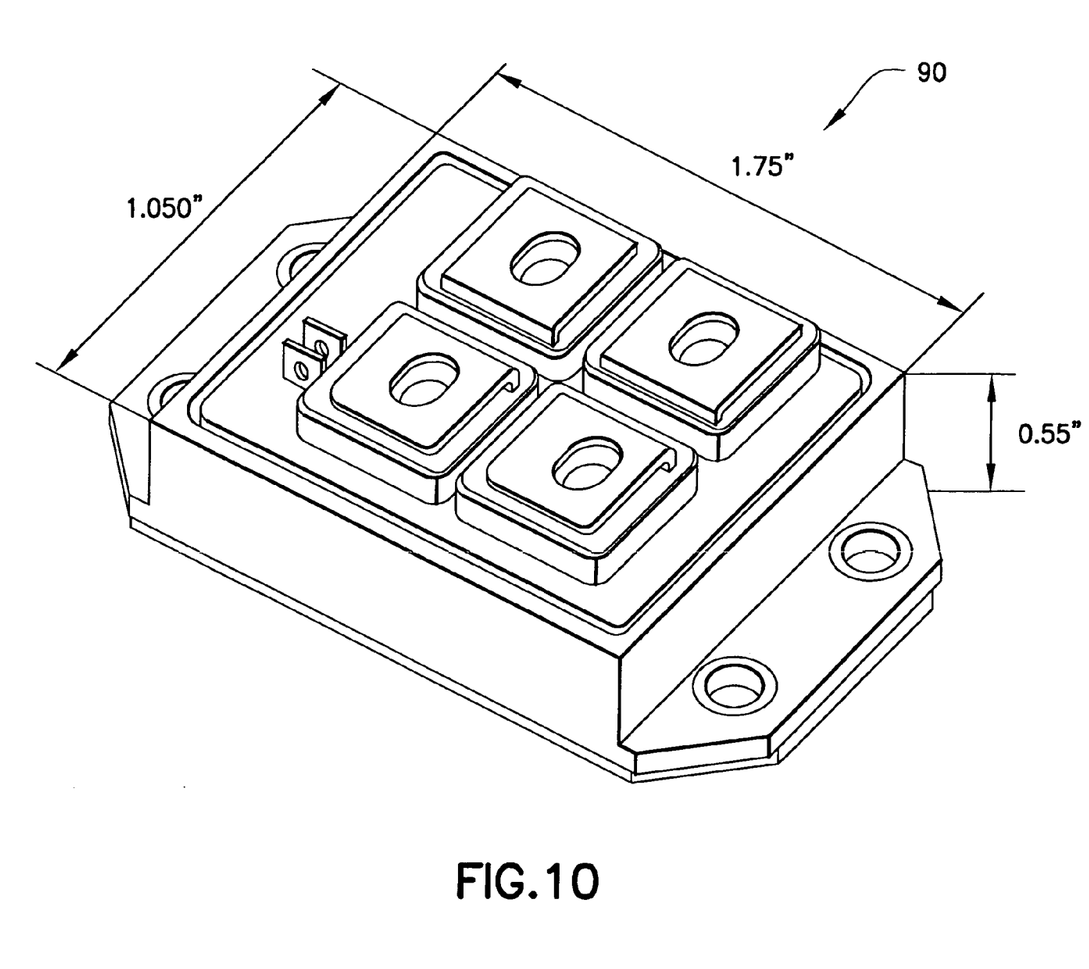
FIG. 10 is a perspective view of the assembled sealed semiconductor power module, according to an aspect of the present invention.

FIG. 10 shows the assembled semiconductor power module 90 in a finished state with the contact portions of the power terminals 61, 62, 63 and 64 folded over in contact with their respective brass inserts. FIG. 10 also shows, by way of example, illustrative dimensions for the semiconductor power module 90 as length 1.750 inches, width 1.050 inches and height 0.550 inches.

The semiconductor power module 90 may include one or more rectifiers, including silicon controlled rectifiers (SCR), or may include a bridge or other types of LCE (load carrying equipment) or power control circuitry. For example, according to an embodiment, the semiconductor power module 90 may handle 600V/150 amps.

As will be understood the components of the semiconductor power module 90 described herein and the particular materials used provide particularly advantageous synergies and performance characteristics.

Although the present invention has been described in relation to particular embodiments thereof, many other combinations, variations and modifications and other uses will become apparent to those skilled in the art. It is preferred, therefore, that the present invention be limited not by the specific disclosure herein, but only by the appended claims.

What is claimed is:
1. A sealed semiconductor power module comprising:
   a metallic base plate having a metallic plating;
   a substrate comprised of aluminum and nitrogen, and having two major surfaces, a bottom surface of the two major surfaces positioned on the base plate and a top surface of the two major surfaces including a first pad and a second pad, the substrate including a directly bonded copper bonding bonded to both of the two major surfaces;
a first die positioned on top of the first pad and a second die positioned on top of the second pad, the first die and the second die each including a main contact area formed integral to each die on a top surface of each die, the first die including a gate area on the top surface of the first die, the gate area being isolated from direct electrical contact with the main contact area of the first die;
a first power terminal in wirebondless electrical connection to the main contact area of the first die via a first molybdenum tab disposed between the main contact area of the first die and the first power terminal, and
a second power terminal in wirebondless electrical connection to the main contact area of the second die via a second molybdenum tab disposed between the main contact area of the second die and the second power terminal;
a third power terminal in wirebondless electrical connection to the substrate via a third molybdenum tab disposed between the third power terminal and the substrate;
a gate terminal in electrical contact with the gate area; and
a cover that includes a frame physically attached to and surrounding the base plate and a lid physically attached to the frame and including apertures above the first die and the second die, the cover configured to seal the first die and the second die,
wherein the first power terminal, the second power terminal, the third power terminal, and the gate terminal extend from an interior space of the cover to the exterior of the cover whereby a contact portion of the first power terminal, a contact portion of the second power terminal, a contact portion of the third power terminal, and a contact portion of the gate terminal traverse the apertures of the lid and are exposed over a top surface of a top of the lid; and
wherein the cover comprises a first metal insert, and the first power terminal is folded over the first metal insert.

2. The sealed semiconductor power module of claim 1, wherein the base plate comprises a nickel and gold plating.

3. The sealed semiconductor power module of claim 1, wherein the base plate is comprised of molybdenum.

4. The sealed semiconductor power module of claim 1, wherein the base plate is comprised of aluminum, silicon and carbon.

5. The sealed semiconductor power module of claim 1, wherein the cover is comprised of an injection molded electrically conductive polymer.

6. The sealed semiconductor power module of claim 1, wherein the cover is physically attached to the base plate by an adhesive bond and is encapsulated with a soft gel.

7. The sealed semiconductor power module of claim 1, wherein the module comprises a rectifier.

8. The sealed semiconductor power module of claim 1, wherein the module comprises a silicon controlled rectifier.

9. The sealed semiconductor power module of claim 1, further comprising a fourth power terminal in direct wirebondless electrical connection with the substrate and having a fourth power terminal contact portion exposed over the top surface of the top of the cover.

10. The sealed semiconductor power module of claim 9, wherein the cover comprises second, third and fourth metal inserts;
the first, second, third, and fourth metal inserts configured to receive, respectively, the contact portion of the first power terminal, the contact portion of the second power terminal, the contact portion of the third power terminal, and the contact portion of the fourth power terminal.

11. A sealed semiconductor power module comprising:
a substrate disposed on a base plate, a top surface of the substrate including a first pad and a second pad;
a first die positioned on top of the first pad of the substrate, a top surface of the first die including a main contact area and a gate area each area being formed integral to said first die, the gate area being isolated from direct electrical contact with the main contact area;
a second die positioned on top of the second pad of the substrate, a top surface of the second die including a main contact area formed integral to said second die;
a lid including apertures above the first die and the second die;
a first power terminal in wirebondless electrical connection with the main contact area of the first die via a first metal tab;
a second power terminal in wirebondless electrical connection with the main contact area of the second die via a second metal tab;
a third power terminal in wirebondless electrical connection with the first pad via a third metal tab;
a gate terminal in electrical contact with the gate area
wherein the first power terminal, the second power terminal, the third power terminal, and the gate terminal each include a contact area and each contact area traverses a respective aperture of the lid and each contact area is exposed over a top surface of a top of the lid; and
wherein the lid comprises a first metal insert, and the first power terminal is folded over the first metal insert.

12. The sealed semiconductor power module of claim 11, wherein the substrate includes a directly bonded copper bonding bonded to both said top surface of said substrate and a bottom surface of said substrate.

13. The sealed semiconductor power module of claim 11, wherein the first die comprises a silicon controlled rectifier.

14. The sealed semiconductor power module of claim 11, further comprising a gate metal tab electrically connected to the first pad of the substrate.

15. The sealed semiconductor power module of claim 11, wherein the first metal tab, the second metal tab, and the third metal tab comprise molybdenum.

16. The sealed semiconductor power module of claim 11, wherein the lid includes second and third metal inserts; the first, second, and third metal inserts configured to receive, respectively, the contact portion of the first power terminal, the contact portion of the second power terminal, and the contact portion of the third power terminal.

17. The sealed semiconductor power module of claim 11, wherein the substrate is comprised of aluminum and nitrogen.

18. The sealed semiconductor power module of claim 11, wherein the first die is interposed between the first metal tab and the substrate.

19. The sealed semiconductor power module of claim 11, wherein the first die comprises a rectifier.

20. The sealed semiconductor power module of claim 19, wherein the second die comprises a diode.

* * * * *